(12) United States Patent
Zhao et al.

(10) Patent No.: US 11,107,900 B2
(45) Date of Patent: Aug. 31, 2021

(54) DUAL-GATE TRANSISTORS AND THEIR INTEGRATED CIRCUITS AND PREPARATION METHOD THEREOF

(71) Applicant: Peking University, Beijing (CN)

(72) Inventors: Chenyi Zhao, Beijing (CN); Donglai Zhong, Beijing (CN); Zhiyong Zhang, Beijing (CN); Lianmao Peng, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 16/854,016

(22) Filed: Apr. 21, 2020

(65) Prior Publication Data
US 2020/0343353 A1  Oct. 29, 2020

(51) Int. Cl.
*H01L 29/423* (2006.01)
*H01L 21/84* (2006.01)
(Continued)

(52) U.S. Cl.
CPC .......... *H01L 29/4238* (2013.01); *H01L 21/84* (2013.01); *H01L 23/5286* (2013.01); *H01L 27/092* (2013.01); *H01L 27/1203* (2013.01); *H01L 29/401* (2013.01); *H01L 29/45* (2013.01); *H01L 29/4966* (2013.01); *H01L 29/517* (2013.01)

(58) Field of Classification Search
CPC . H01L 29/4238; H01L 21/84; H01L 23/5286; H01L 27/092; H01L 29/401; H01L 29/45; H01L 29/4966; H01L 29/517; H01L 27/1203
See application file for complete search history.

(56) References Cited

U.S. PATENT DOCUMENTS 6,323,071 B1 * 11/2001 Zhang ................. H01L 27/1251
438/162
2003/0179600 A1 * 9/2003 Nii ....................... H01L 27/1203
365/154
(Continued)

FOREIGN PATENT DOCUMENTS

EP          0852400 A2 *  7/1998  ........... H01L 27/092

*Primary Examiner* — Douglas W Owens
(74) *Attorney, Agent, or Firm* — SV Patent Service (57) ABSTRACT

A dual-gate transistor and its production method are disclosed. An auxiliary gate is connected to the power supply of the integrated circuits, to form thick and high square-shaped potential barrier of minority carriers adjacent to the drain electrode, while the potential barrier is transparent for the majority carriers from the source electrodes. The potential barrier can effectively inhibit reverse minority carrier tunneling from the drain electrode at large drain-source voltage. The transistor can be easily turned on at small drain-source voltage, without significantly decreasing the on-state current. The dual-gate transistor can significantly suppress ambipolar behavior with increased current on/off ratio and reduced power consumption, and maintain the high performance. Based on transistors, strengthened CMOS circuits can have high noise margin, low voltage loss, reduced logic errors, high performance and low power consumption. Moreover, no additional power sources are added to the circuit, which makes it suitable for ultra-large-scale integrated circuits.

8 Claims, 8 Drawing Sheets

(51) Int. Cl.
    *H01L 23/528*     (2006.01)
    *H01L 29/51*     (2006.01)
    *H01L 27/092*     (2006.01)
    *H01L 27/12*     (2006.01)
    *H01L 29/40*     (2006.01)
    *H01L 29/45*     (2006.01)
    *H01L 29/49*     (2006.01)

(56) References Cited

U.S. PATENT DOCUMENTS

2016/0301365 A1* 10/2016 Jacquemod ............ H03B 27/00
2018/0061919 A1* 3/2018 Toyotaka .......... H01L 29/78648

\* cited by examiner

DUAL-GATE TRANSISTORS AND THEIR INTEGRATED CIRCUITS AND PREPARATION METHOD THEREOF

FIELD OF THE INVENTION

This invention belongs to the field of semiconductor circuit and device technology, and in particular, relates to a dual-gate transistor and its CMOS circuits with high performance and low power consumption and its preparation method.

BACKGROUND OF THE INVENTION

Semiconductor materials, especially small-bandgap semiconductor materials have great potential in the field of high-speed integrated circuits. For example, novel nano materials such as carbon nanotubes and graphene nano ribbons have good application prospects in flexible electronics and display drive circuits. Indium antimonide, indium arsenide, and other traditional small-bandgap materials are widely used in the field of radio-frequency integrated circuits. However, conventional non-doped (doping-free) small-bandgap semiconductor transistors generally exhibit ambipolar behaviors, which leads to smaller current on/off ratios. The large off-state current comes from tunneling of minority carriers near the drain electrode when the drain-source voltage is at high level. Take N-type transistor as an example. At high drain-source voltage and zero gate-source voltage, the potential barrier of majority carriers (electrons) near the source electrode is thick and tall, while the potential barrier of minority carriers (holes) near the drain electrode is very thin. Therefore, excess holes will tunnel from the drain electrode to the transistor channel, which results in an increase of the off-state current, thus a decrease of current on/off ratio, an increased sub-threshold swing, which is significant ambipolar effect. This effect will then increase the static power consumption of a small-bandgap semiconductor integrated circuits and also make the circuits prone to logic errors. With the rapid development of microfabrication, the size of transistors has been continuously scaled down while the high performance of transistors must be maintained. The increased power consumption, especially the static power consumption, has become increasingly difficult to overcome, which is one of the major concerns in the semiconductor industry. Moreover, the ambipolar behaviors in transistors will largely reduce the noise margin and output voltage loss of their related integrated circuits. Therefore, a critical task for designing integrated circuits with fore-mentioned semiconductors is to suppress the ambipolar behaviors and to improve the current on/off ratio at its operating voltages, while simultaneously maintain the high performance and low power consumption.

To address this, an auxiliary gate can be added near the drain electrode and connect it to the drain electrode, thereby increasing the thickness of potential barrier of minority carriers near the drain electrode and reducing the tunneling current. In this way, the current on/off ratio is improved. The biggest disadvantage of this method is that at low drain-source bias, the potential barrier of majority carriers near the drain electrode is undesirably larger. Even if the voltage of the main gate is adjusted above the threshold voltage, the drain current of transistor is still not high enough and the transistor output curves may exhibit Schottky diode behavior. This can cause serious electrical voltage losses, reduced noise margin, waveform distortions, and even logic errors in the related circuits. Therefore, there is an urgent need for a method that can not only suppress the ambipolar effects in the small-bandgap semiconductor transistors but also ensure the transistor and circuit performance, without additional power supply circuits or components.

SUMMARY OF THE INVENTION

For the problems in the prior art, an objective of the present invention is to provide a dual-gate transistor and its preparation method, which can inhibit ambipolar effects, while also ensuring device and circuit performance, without additional requirement for power supply circuits or components.

To achieve the above objective, the technical solution provided by the present invention is as follows:

A dual-gate transistor includes an insulating substrate, a semiconductor layer on the insulating substrate, and at least one P-type transistor or at least one N-type transistor, wherein the semiconductor layer includes a plurality of channel regions separated from each other, wherein each of the plurality of channel regions is provided with a P-type transistor or an N-type transistor.

The P-type transistor includes a pair of contact electrodes on the channel region, wherein one of the electrodes is a source electrode and the other one of the electrodes is a drain electrode, a gate dielectric layer covering on channel region, a main gate electrode on the gate dielectric layer near the source electrode, and an auxiliary gate electrode near the drain electrode.

The N-type transistor includes a pair of contact electrodes on the channel region, wherein one of the electrodes is a source electrode and the other one of the electrodes is a drain electrode, a gate dielectric layer covering on channel region, a main gate electrode on the gate dielectric layer near the source electrode, and an auxiliary gate electrode near the drain electrode.

The auxiliary gate electrodes of the P-type transistor and the N-type transistor are connected with GND and VDD, respectively.

Other electrodes of the transistors are connected as conventional circuits determined by its desired functions.

Further, the insulating substrate can include silicon/silicon dioxide, quartz, glass, $Al_2O_3$, PET, PEN, or PI.

Further, the semiconductor layer can include one or more materials comprising semiconducting-type carbon nanotubes, graphene nanobelts, $MoS_2$, $WS_2$, black phosphorus, Si, Ge, InAs, InSb, PbS, PbSe, or PbTe. The semiconductor layer is formed by a single nanostructure including dot/layer/wire composed of one of the materials or a composite dot/layer/wire composed of two or more of the materials.

Further, the semiconductor layer can have a bandgap smaller than 1 eV.

Further, the pair of contact electrodes, the main gate electrode and auxiliary gate in the P-type transistor or the N-type transistor can include one or more materials which can include Pd, Pt, Ta, Ti, Cr, Ca, Cu, Al, Au, W, Y, Sc, conductive metal silicide, and doped polysilicon.

Further, the gate dielectric layer material in the P-type transistor or the N-type transistor can include a high-dielectric constant (κ) oxide insulating material. The high-κ oxide insulating material can include $Al_2O_3$, $HfO_2$, $Y_2O_3$, and $Zr_2O_3$, wherein interlayer interconnections are formed by a low-κ insulating material comprising $SiO_2$, SiC, or PMMA. The high-κ insulating material can have a κ value greater than 3.9, and the low-κ insulating material can have a κ value less to 3.9.

A method for manufacturing a dual-gate transistor can include one or more of the following steps:

1) forming a semiconductor layer on an insulating substrate;

2) patterning the semiconductor layer into channel regions separated from each other;

3) forming contact regions on the semiconductor layer respectively for source electrodes and drain electrodes of a P-type transistor and an N-type transistor;

4) depositing a gate dielectric layer on the channel between the contact regions;

5) forming a main gate electrode on the gate dielectric layer near the source electrodes;

6) forming an auxiliary gate electrode separate from the main gate electrode on the gate dielectric layer near the drain electrodes;

7) forming an electric connection between the auxiliary gate electrode of the P-type transistor and GND, forming an electric connection between the auxiliary gate electrode and a source electrode of the N-type transistor and VDD, thereby forming two pairs of dual-gates electrodes consisting conventional main gates and power-compositing auxiliary gates; and 8) forming an insulation layer to separate multiple layers of interconnections in the circuit.

Further, the step of forming a semiconductor layer can include different process methods, such as, dry transfer, coating, nano ink jet printing, or spin coating, etching.

Steps 2)-8) can use different patterning processes. The source electrodes, the drain electrodes, the main gate electrode, the auxiliary gate electrode, and the gate dielectric layer can be formed by any of the following processes or their combinations comprising: photolithography or electron beam lithography, electron beam evaporation, sputtering, spin coating and cured, sol-gel, atomic layer deposition, and peeling or plasma etching.

Further, the insulating spacer layer material in step 8) can be an organic insulating material or an inorganic insulating material, wherein the organic insulating material comprises PMMA, wherein the inorganic insulating material can include silicon dioxide or silicon nitride.

According to the present invention, two discrete gate electrodes are fabricated on the prepared gate dielectric layer, which are a main gate and an auxiliary gate, respectively. The auxiliary gate of the P-type transistor is connected to the circuit ground (GND), and the auxiliary gate of the N-type transistor is connected to the supply voltage (VDD) of the circuit.

Compared with the prior art, the presently disclosed transistors, integrated circuits and method can include one or more of the following advantages:

1. The power supply voltage and its ground terminal are feedback to the auxiliary gates for N-type and P-type transistors, respectively, which alter the shape of the barrier potential near the drain electrodes. A high and thick potential barrier of minority carriers is formed in a clamped manner in the vicinity of the drain electrode, and it can effectively inhibit the reverse minority carrier tunneling from the drain electrode at even very large drain-source bias voltage, while suppressing ambipolar behaviors, increasing current on/off ratio of the transistor, thereby reducing the static power consumption of the integrated circuit;

2. The high and thick potential barrier of minority carriers near the drain electrodes does not affect the majority carriers coming from the source electrodes, so even at low drain-source bias voltage, the transistor can be turned on as usual. Thus, the on-state current does not get decreased and the output curves exhibit near-ideal behaviors. By this means, the transistors demonstrate significant suppress of ambipolar behaviors and meanwhile ensure the desirable on-state performance; and 3. The disclosed method makes it possible to prepare transistors with large current on/off ratio, high on-state performance and low power consumption, without adding extra power supplies or related circuits, which improves the performance and reduce the power consumption of the overall system build with these transistors. The disclosed method can prepare high-performance and low-power-consumption semiconductor integrated circuits.

BRIEF DESCRIPTION OF THE DRAWINGS

FIGS. 5A-5E show electrical characteristic curves of the transistors prepared using the presently disclosed methods.

DETAILED DESCRIPTION OF THE INVENTION

In order to make the above features and advantages of the present invention more comprehensible, embodiments are described below in detail with reference to the accompanying drawings.

Figure 1A:
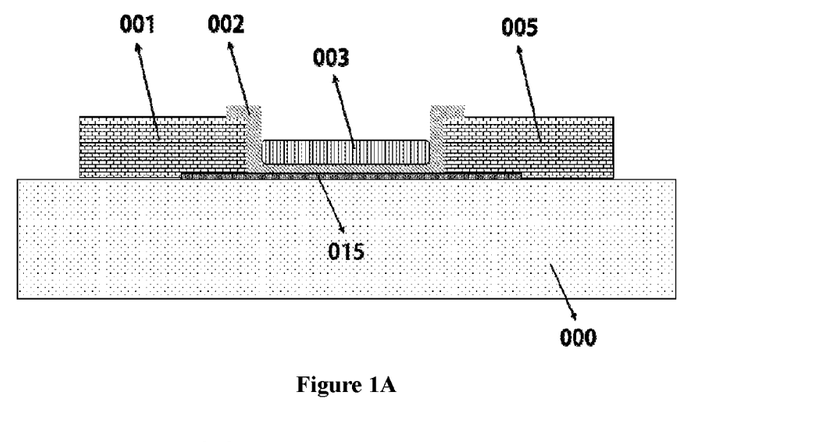
FIG. 1A is a schematic diagram of a conventional self-aligned carbon nanotube transistor.
Figure 1B:
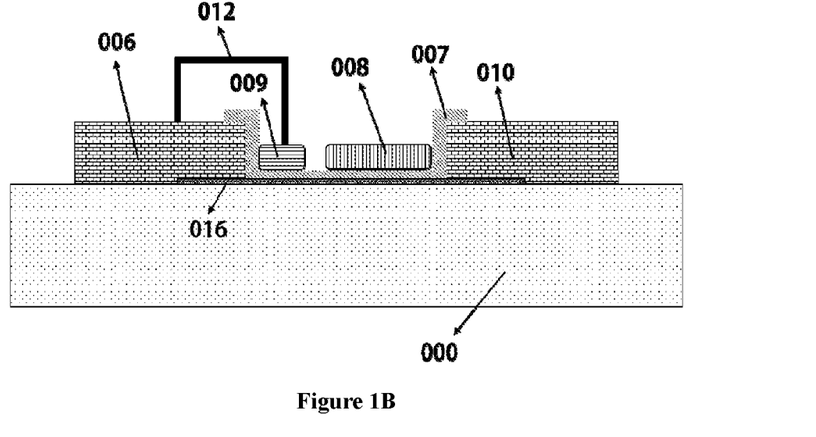
FIG. 1B is a schematic diagram of a conventional dual-gate transistor.
Figure 1C:
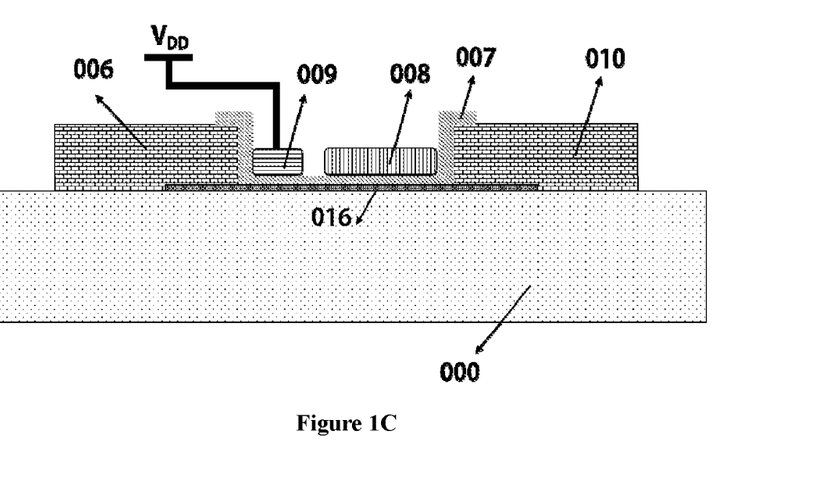
FIG. 1C is a schematic diagram of a dual-gate semiconductor N-type transistor in accordance with the present invention.
Figure 1D:
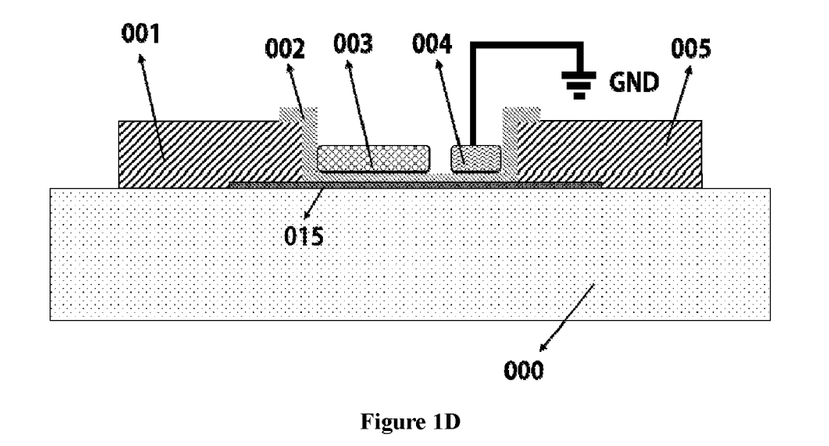
FIG. 1D is a schematic diagram of a dual-gate semiconductor P-type transistor in accordance with the present invention.

In some embodiments, as shown in FIGS. 1C/1D, a dual-gate transistor includes an insulating substrate 000, a semiconductor layer 015/016 on the insulating substrate 000, and at least one P-type transistor or at least one N-type transistor. The semiconductor layer 015/016 includes a plurality of mutually separated channel regions, as shown in the two channel regions 015 and 016 respectively in FIGS. 1C/1D. FIG. 1D shows a P-type transistor. The P-type transistor includes a pair of contact electrodes 001/005 made of Pd on the semiconductor layer 015, one of which is a source electrode 001 connected to VDD and another is a drain electrode 005. A gate dielectric layer 002 is formed between the pair of electrodes 001/005. A main gate electrode 003 is formed on the gate dielectric layer 002 near the source electrode 001. An auxiliary gate electrode 004 is formed near the drain electrode 005.

FIG. 1C includes an N-type transistor. The N-type transistor includes a pair of contact electrodes 006/010 made of Sc on the semiconductor layer 016, one of which is a drain electrode 006 and the other is a source electrode 010 connected to GND. A gate dielectric layer 007 is formed between the pair of electrodes 006/010. On the gate dielectric layer 007, a main gate electrode 008 is formed at a position near the source electrode 010, and a gate electrode auxiliary 009 is formed near the drain electrode 006. The auxiliary gate electrode 004 of the P-type transistor is connected to the grounded source electrode 010 via line 001. The auxiliary gate electrode 009 in the N-type transistor is connected via connection line 012 to the source electrode 001 that supplies operating voltage.

Figure 2A:
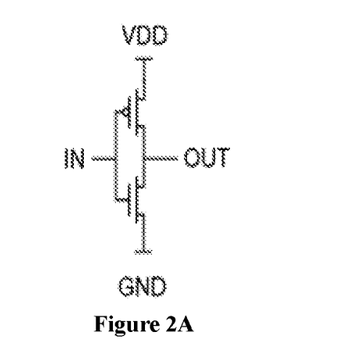
FIG. 2A is a circuit diagram of a conventional CMOS inverter based on conventional self-aligned structure transistors.
Figure 2B:
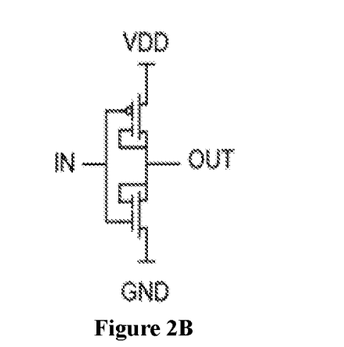
FIG. 2B is a circuit diagram of a conventional CMOS inverter based on conventional feedback gate structure transistors.
Figure 2C:
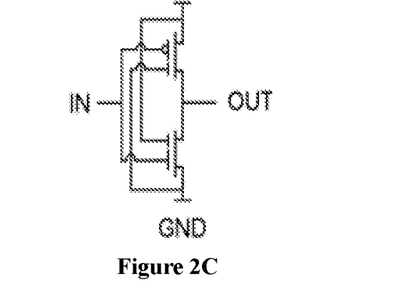
FIG. 2C is a circuit diagram of a dual-gate CMOS inverter in accordance with some embodiments of the present invention.
Figure 3A:
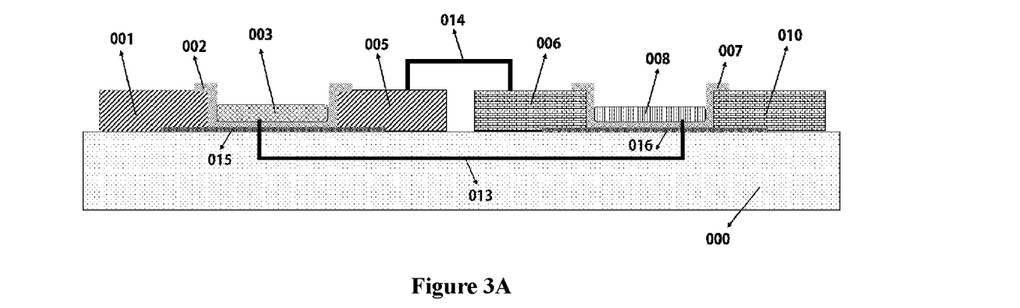
FIG. 3A is a schematic diagram of a conventional CMOS inverter based on conventional self-aligned structure transistors.
Figure 3B:
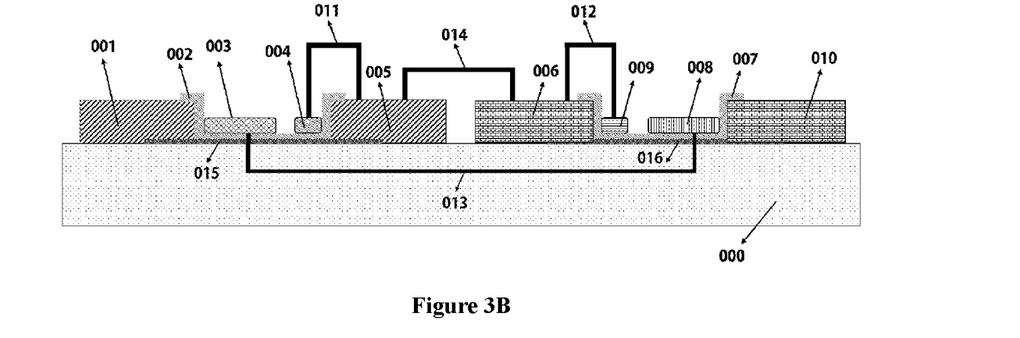
FIG. 3B is a schematic diagram of a conventional CMOS inverter based on conventional feedback-gate structure transistors.
Figure 3C:
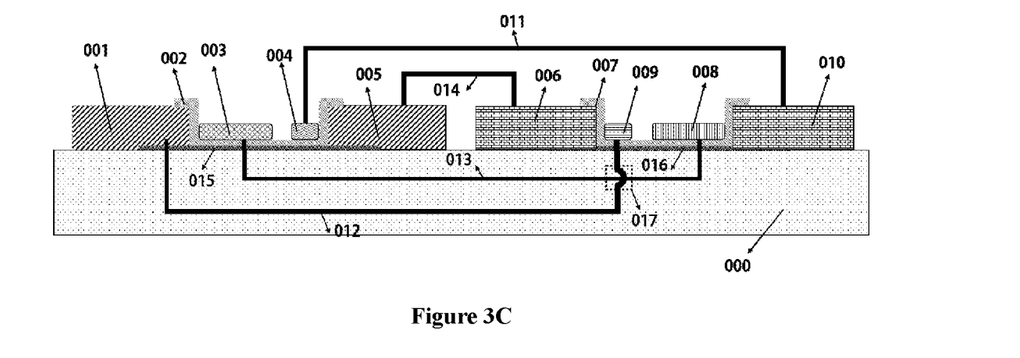
FIG. 3C is a schematic diagram of a strengthened CMOS inverter in accordance with some embodiments of the present invention.
Figure 4A:
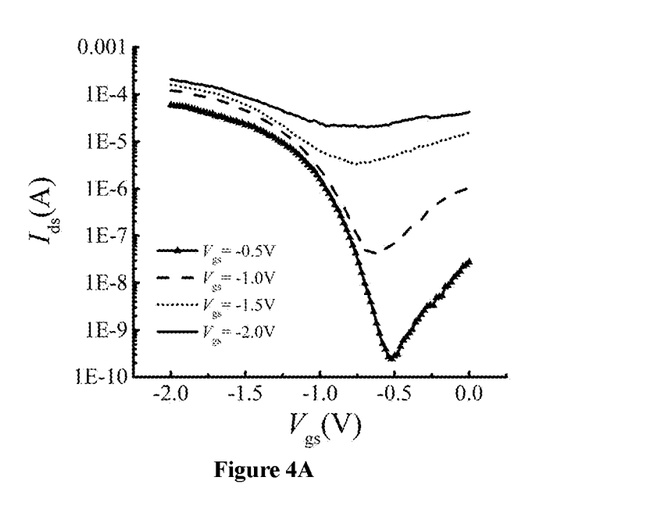
FIG. 4A-4B show transfer characteristic curves of the transistors prepared using a conventional self-aligned structure.
Figure 4B:
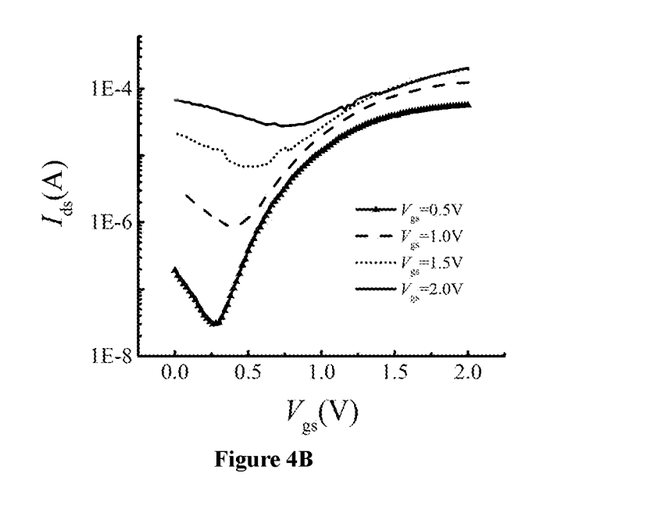
Figure 4C:
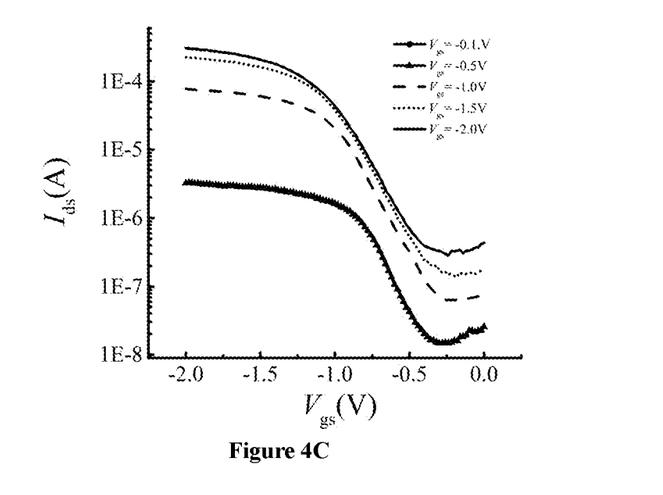
FIG. 4C-4E show transfer characteristic curves of the transistors prepared using a conventional feedback gate structure.
Figure 4D:
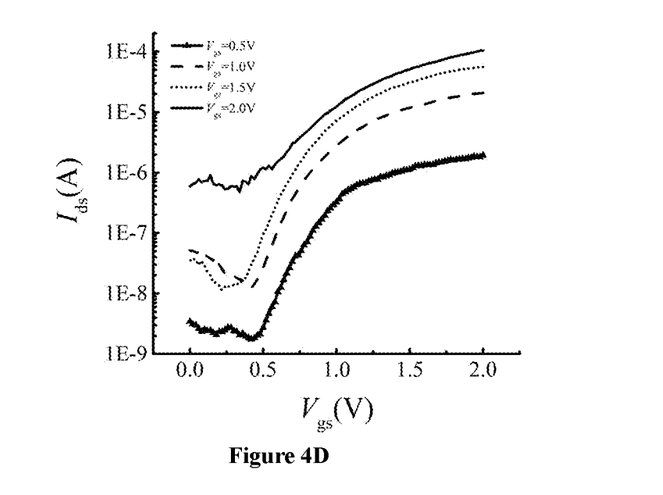
Figure 4E:
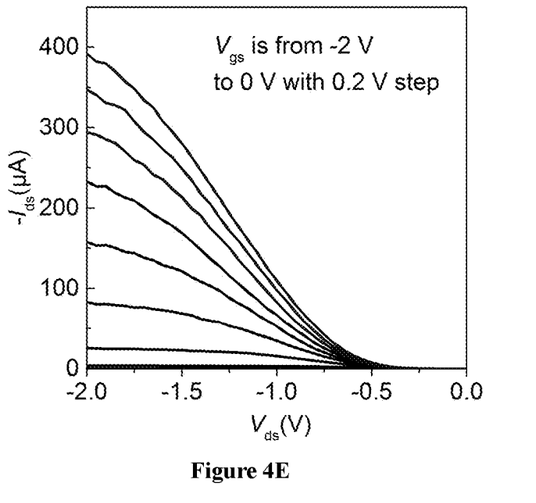
Figure 5A:
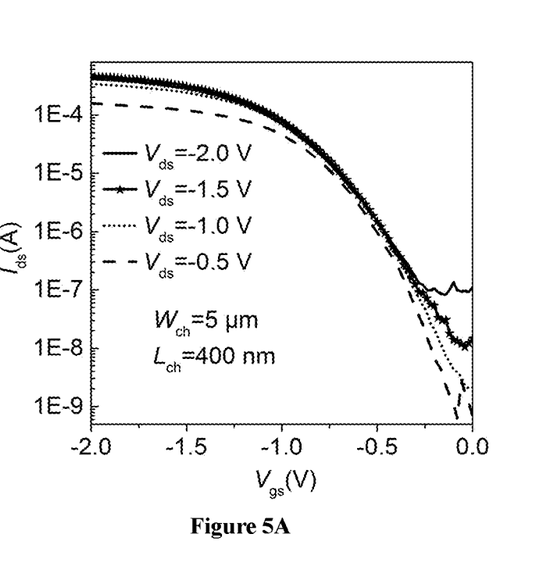
FIG. 5A shows transfer characteristic curves of a dual-gate semiconductor P-type transistor (PMOS) in accordance with some embodiments of the present invention.
Figure 5B:
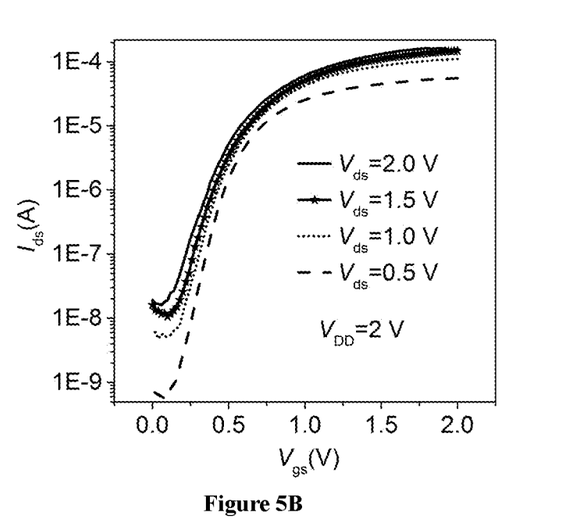
FIG. 5B shows transfer characteristic curves of a dual-gate semiconductor N-type transistor (NMOS) in accordance with some embodiments of the present invention.
Figure 5C:
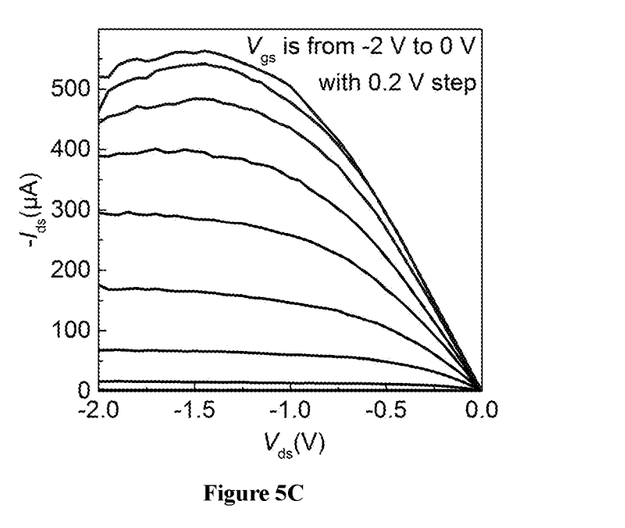
FIG. 5C shows output characteristic curves of a dual-gate semiconductor P-type transistor (PMOS) in accordance with some embodiments of the present invention.
Figure 5D:
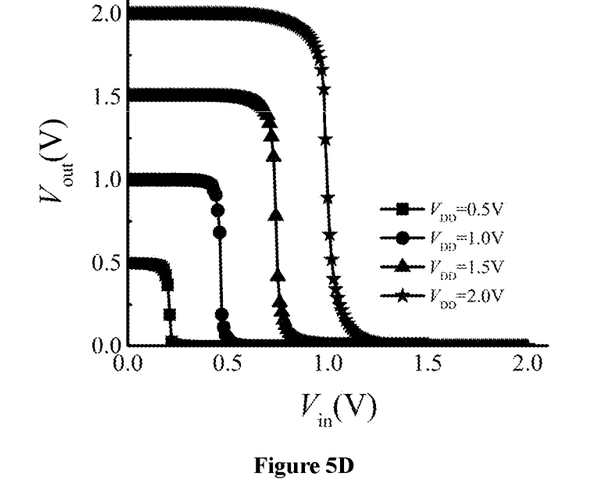
FIG. 5D is a voltage graph of a CMOS inverter in a dual-gate transistor circuit in accordance with some embodiments of the present invention.
Figure 5E:
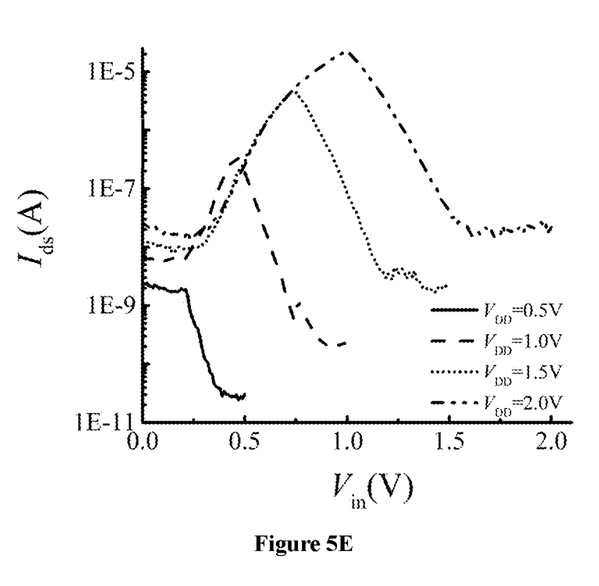
FIG. 5E is an operation current diagram of a CMOS inverter in a dual-gate transistor circuit in accordance with some embodiments of the present invention.

Comparing FIGS. 1C/1D to the conventional transistors shown in FIGS. 1A-1B, the present transistors can suppress ambipolar behavior, improve current on/off ratio at large drain-source voltage while ensuring high on-state current at small drain-source voltage of the transistors. The two unchanged power supplies GND and VDD in the circuit are respectively connected to two auxiliary gates of P-type and N-type transistors. A thick and high potential barrier of minority carriers is formed near the drain electrode, which inhibits reverse minority carrier tunneling from the drain electrode at large drain-source voltage. While the thick and high potential barrier near drain electrode is transparent for majority carriers from source electrode, so even at a small drain-source voltage, the transistor can be easily turned on and on-state current won't decrease a lot. The circuit diagram of a strengthened CMOS inverter is shown in FIG. 2C, which is distinctly different from conventional CMOS inverters shown in FIGS. 2A-2B. The strengthened CMOS inverter in this embodiment is shown in FIG. 3C. Conventional CMOS inverters with self-aligned gate structure and feedback gate structure are respectively shown in FIGS. 3A-3B.

In the following, semiconducting-type carbon nanotube thin film is used as an example for a semiconductor layer. Based on dual-gate transistors, strengthened CMOS circuits can have high noise margin, low voltage loss, reduced logic errors, high performance and low power consumption. Here we take most fundamental circuit-inverter as an example to decrease how to show advantages in circuit level, but it won't be just limit to this. A CMOS inverter based on a carbon nanotube film can be prepared using a method to be described specifically as follows:

1. In this example, a semiconducting-type carbon nanotube film can be obtained by solution deposition, or by self-assembly, alignment, spin coating, growth, and transfer, etc.

2. In this example, the insulating substrate 000 may be made of a silicon/silicon dioxide, quartz, glass, aluminum, or other hard materials, or PET, PEN, PI, or other high temperature flexible insulating materials;

3. A semiconducting-type carbon nanotube film is deposited on the silicon/silicon dioxide and is patterned according to a desired shape. The excess portion is etched away with $O_2$ plasma or other methods;

4. On the patterned carbon nanotube film, a pair of Pd electrodes 001/005 is formed by electron beam lithography and electron beam evaporation. The electrodes have a thickness of 60 nm and a width of 300 nm, with spacing of 500 nm in between;

5. On the Pd electrodes 001/005, a gate dielectric material $HfO_2$ is grown by electron beam lithography and atomic layer deposition (ALD) on the electrodes and on the carbon nanotube film in the channels between the electrodes, which forms the gate dielectric layer 002 having a thickness of 8 nm;

6. Near the source electrode, Pd is evaporated as the main gate electrode 003 by electron beam lithography and electron beam evaporation. The main gate electrode 003 has a thickness of 15 nm. Near the drain electrode, Pd is evaporated as the auxiliary gate electrode 004 by electron beam lithography and electron beam evaporation. The auxiliary gate electrode has a thickness of 15 nm. The two electrodes are spaced apart by a distance about 50-100 nm;

7. Next to these electrodes, Sc electrodes 006/010 are formed, by electron beam lithography and electron beam evaporation. The Sc electrodes have a thickness of 60 nm, a width of 300 nm, and a spacing 500 nm in between;

8. On the pair of Sc electrodes 006/010, a gate dielectric material $HfO_2$ is grown by electron beam lithography and atomic layer deposition (ALD) on the electrodes and on the carbon nanotube film in the channels between the electrodes, which forms the gate dielectric layer 007 having a thickness of 8 nm;

9. Near the source electrode, Pd is evaporated as the main gate electrode 008 by electron beam lithography and electron beam evaporation. The main gate electrode 008 has a thickness of 15 nm. Near the drain electrode, Sc is evaporated as the auxiliary gate electrode 009 by electron beam lithography and electron beam evaporation. The auxiliary gate electrode has a thickness of 15 nm. The distance between the two electrodes is about 50-100 nm;

10. An Au electrode is made using electron beam lithography and electron beam evaporation, to form the wiring 011 and the wiring 012. The Au electrode thickness is about 40 nm. In the P-type transistor, the auxiliary gate electrode 004 near the drain electrode is connected to the grounded source electrode 010 by of by a wiring 011 connected to the GND. In the N-type transistor, the auxiliary gate electrode 009 near the drain electrode is connected to the source electrode 001 at VDD through a connection line 012;

11. An Au electrode is made using electron beam lithography and electron beam evaporation, to form the wiring 013 and the wiring 014. The Au electrode thickness is about 150 nm. As shown in FIG. 3C, the main gate electrode 003 near the source electrode and the main gate electrode 008 are connected by a wiring 013. The Pd drain electrode 005 and the Sc drain electrode 006 are connected via wires 014. If any two of the intermediate wire electrodes have overlap, an insulating spacer layer 017 in the dashed box is sued for isolation. The insulating spacer layer 17 in this embodiment is formed by a crosslinked PMMA that has been bombarded by an electron beam at a high dose, and has a thickness of approximately 60-100 nm; and 12. The method and approach described in this invention can be applied to any transistor and all of their related circuits with semiconductors in general, not just for the small band-gap materials nor just for inverters.

The above embodiments are only used to illustrate the technical solution of the present invention but not to limit it. Those skilled in the art can modify or equivalently replace the technical solution of the present invention without departing from the spirit and scope of the present invention. The scope of protection shall be subject to the claims.

What is claimed is:

1. A dual-gate transistor, comprising:
   an insulating substrate;
   a semiconductor layer on the insulating substrate; and
   at least one P-type transistor or at least one N-type transistor,
   wherein the semiconductor layer includes a plurality of channel regions separated from each other, wherein each of the plurality of channel regions is provided with a P-type transistor or an N-type transistor,
   wherein the P-type transistor includes:
      a pair of contact electrodes on the channel region, wherein one of the electrodes is a source electrode connected to VDD and the other one of the electrodes is a drain electrode,
      a gate dielectric layer between the pair of contact electrodes;
      a main gate electrode on the gate dielectric layer near the source electrode; and
      an auxiliary gate electrode near the drain electrode connected to GND,
   wherein the N-type transistor includes:
      a pair of contact electrodes on the channel region, wherein one of the electrodes is a source electrode connected to GND and the other one of the electrodes is a drain electrode,
      a gate dielectric layer between the pair of electrodes;
      a main gate electrode on the gate dielectric layer near the source electrode; and
      an auxiliary gate electrode near the drain electrode connected to VDD,
   wherein the auxiliary gate electrodes of P-type transistor and N-type transistor are respectively connected with GND and VDD.

2. The dual-gate transistor of claim 1, wherein the insulating substrate comprises silicon/silicon dioxide, quartz, glass, $Al_2O_3$, PET, PEN, or PI.

3. The dual-gate transistor of claim 1, wherein the semiconductor layer includes one or more materials comprising semiconducting-type carbon nanotubes, graphene nano ribbons, $MoS_2$, $WS_2$, black phosphorus, Si, Ge, InAs, InSb, PbS, Pb Se, or PbTe, wherein the semiconductor layer is formed by a single layer composed of one of the materials or a composite layer composed of two or more of the materials.

4. The dual-gate transistor of claim 1, wherein the semiconductor layer has a bandgap smaller than 1 eV.

5. The dual-gate transistor of claim 1, wherein the pair of contact electrodes, the main gate electrode and auxiliary gate electrodes in the P-type transistor or the N-type transistor includes one or more materials comprising Pd, Pt, Ta, Ti, Cr, Ca, Cu, Al, Au, W, Y, Sc, conductive metal silicide, and doped polysilicon.

6. The dual-gate transistor of claim 1, wherein the gate dielectric layer material in the P-type transistor or the N-type transistor includes a high-κ oxide insulating material, wherein the high-κ oxide insulating material includes $Al_2O_3$, $HfO_2$, $Y_2O_3$, $Zr_2O_3$, wherein interlayer interconnections are formed by a low-κ insulating material comprising $SiO_2$, SiC, or PMMA, wherein the high-κ insulating material has a κ value greater than 3.9, and the low-κ insulating material has a κ value less to 3.9.

7. The dual-gate transistor of claim 1, wherein the auxiliary gate electrode in the P-type transistor is made of a high work-function metal including Pd or Ta, wherein the auxiliary gate electrode in the N-type transistor is made of a low work-function metal including Sc or Ti.

8. An integrated circuit, comprising a dual-gate transistor of claim 1.

* * * * *